(12) United States Patent
Foster, Sr. et al.

(10) Patent No.: US 9,076,770 B2
(45) Date of Patent: *Jul. 7, 2015

(54) INTEGRATED CIRCUIT DIE STACKS HAVING INITIALLY IDENTICAL DIES PERSONALIZED WITH FUSES AND METHODS OF MANUFACTURING THE SAME

(75) Inventors: Jimmy G. Foster, Sr., Morrisville, NC (US); Kyu-Hyoun Kim, Mount Kisco, NY (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 340 days.

This patent is subject to a terminal disclaimer.

(21) Appl. No.: 13/569,267

(22) Filed: Aug. 8, 2012

(65) Prior Publication Data

US 2012/0299640 A1    Nov. 29, 2012

Related U.S. Application Data

(63) Continuation of application No. 12/616,912, filed on Nov. 12, 2009, now Pat. No. 8,315,068.

(51) Int. Cl.
*H01L 23/48* (2006.01)
*H01L 23/525* (2006.01)
(Continued)

(52) U.S. Cl.
CPC .......... *H01L 23/481* (2013.01); *H01L 23/5256* (2013.01); *H01L 25/0657* (2013.01);
(Continued)

(58) Field of Classification Search
USPC .......... 361/782–784, 792–795, 803; 257/676–686, 700–710, 777–780
See application file for complete search history.

(56) References Cited

U.S. PATENT DOCUMENTS 4,131,516 A   12/1978   Bakos et al.
4,733,461 A    3/1988   Nakano
(Continued)

FOREIGN PATENT DOCUMENTS

EP    0213205 A1   11/1987
EP    1202296 A1    2/2002
(Continued)

OTHER PUBLICATIONS

Anonymous; Method for a Cylindrical Chip Capacitor; IP.com Prior Art Database Technical Disclosure; Mar. 16, 2005; pp. 1-10, IP.com.
(Continued)

*Primary Examiner* — Tuan T Dinh
(74) *Attorney, Agent, or Firm* — Edward J. Lenart; Katherine S. Brown; Kennedy Lenart Spraggins LLP

(57) ABSTRACT

Integrated circuit die stacks having a first die mounted upon a substrate, the first die manufactured to be initially identical to a second die with a plurality of through silicon vias ('TSVs'), the first die personalized by blowing fuses on the first die, converting the TSVs previously connected through the blown fuses into pass-through vias ('PTVs'), each PTV implementing a conductive pathway through the first die with no connection to any circuitry on the first die; and the second die, manufactured to be initially identical to the first die and later personalized by blowing fuses on the second die, the second die mounted upon the first die so that the PTVs in the first die connect signal lines from the substrate through the first die to TSVs in the second die.

15 Claims, 8 Drawing Sheets

(51) Int. Cl.
*H01L 25/065* (2006.01)
*H01L 25/00* (2006.01)
*H01L 25/18* (2006.01)

(52) U.S. Cl.
CPC .............. *H01L25/18* (2013.01); *H01L 25/50* (2013.01); *H01L 2225/06527* (2013.01); *H01L 2225/06541* (2013.01); *H01L 2225/06555* (2013.01); *H01L 2924/3011* (2013.01); *H01L 2924/0002* (2013.01)

(56) References Cited

U.S. PATENT DOCUMENTS

| | | | |
|---|---|---|---|
| 5,296,686 | A | 3/1994 | Ullrich et al. |
| 5,452,178 | A | 9/1995 | Emesh et al. |
| 5,839,184 | A | 11/1998 | Ho et al. |
| 5,963,464 | A | 10/1999 | Dell et al. |
| 5,967,799 | A | 10/1999 | Arai |
| 5,998,259 | A | 12/1999 | Chuang |
| 6,194,774 | B1 | 2/2001 | Cheon |
| 6,197,181 | B1 | 3/2001 | Chen |
| 6,208,225 | B1 | 3/2001 | Miller |
| 6,290,833 | B1 | 9/2001 | Chen |
| 6,300,578 | B1 | 10/2001 | Hoffmeyer et al. |
| 6,376,914 | B2 | 4/2002 | Kovats et al. |
| 6,404,001 | B2 | 6/2002 | Koo et al. |
| 6,512,285 | B1 | 1/2003 | Hashemi et al. |
| 6,541,712 | B1 | 4/2003 | Gately et al. |
| 6,621,012 | B2 | 9/2003 | Crockett et al. |
| 6,627,985 | B2 * | 9/2003 | Huppenthal et al. .......... 257/686 |
| 6,638,410 | B2 | 10/2003 | Chen et al. |
| 6,646,520 | B2 | 11/2003 | Miller |
| 6,653,170 | B1 | 11/2003 | Lin |
| 6,678,145 | B2 | 1/2004 | Naito et al. |
| 6,680,659 | B2 | 1/2004 | Miller |
| 6,717,071 | B2 | 4/2004 | Chang et al. |
| 6,775,901 | B1 | 8/2004 | Lee et al. |
| 6,803,665 | B1 | 10/2004 | Megahed et al. |
| 6,822,529 | B2 | 11/2004 | Miller |
| 6,853,003 | B2 | 2/2005 | Lee |
| 6,913,471 | B2 | 7/2005 | Smith |
| 6,927,481 | B2 | 8/2005 | Gibson et al. |
| 6,958,547 | B2 | 10/2005 | Dubin et al. |
| 6,983,535 | B2 | 1/2006 | Crockett et al. |
| 7,005,721 | B2 | 2/2006 | Nishijima |
| 7,030,712 | B2 | 4/2006 | Brunette et al. |
| 7,118,985 | B2 | 10/2006 | Allman et al. |
| 7,123,497 | B2 | 10/2006 | Matsui et al. |
| 7,154,356 | B2 | 12/2006 | Brunette et al. |
| 7,186,919 | B2 | 3/2007 | Kim et al. |
| 7,204,648 | B2 | 4/2007 | Aronson |
| 7,227,240 | B2 | 6/2007 | Knapp et al. |
| 7,249,337 | B2 | 7/2007 | Gisin et al. |
| 7,277,005 | B2 | 10/2007 | Kang et al. |
| 7,342,300 | B2 | 3/2008 | Wight et al. |
| 7,916,511 | B2 | 3/2011 | Park |
| 8,064,222 | B2 | 11/2011 | Nishio et al. |
| 8,349,729 | B2 * | 1/2013 | Barth et al. .................. 438/637 |
| 2002/0191366 | A1 | 12/2002 | Naito et al. |
| 2002/0195271 | A1 | 12/2002 | Gailus |
| 2003/0137042 | A1 | 7/2003 | Mess et al. |
| 2004/0232559 | A1 | 11/2004 | Adelmann |
| 2005/0010725 | A1 | 1/2005 | Eilert |
| 2005/0062556 | A1 | 3/2005 | Aronson |
| 2005/0082664 | A1 | 4/2005 | Funaba et al. |
| 2005/0178669 | A1 | 8/2005 | Strubbe |
| 2005/0184825 | A1 | 8/2005 | Oran |
| 2005/0233501 | A1 | 10/2005 | Nose et al. |
| 2007/0096332 | A1 | 5/2007 | Satoh et al. |
| 2007/0103251 | A1 | 5/2007 | Fan et al. |
| 2007/0117348 | A1 | 5/2007 | Ramanathan et al. |
| 2008/0054428 | A1 | 3/2008 | Lam |
| 2009/0049414 | A1 | 2/2009 | Mutnury et al. |
| 2009/0127668 | A1 * | 5/2009 | Choi ............................ 257/621 |
| 2010/0124035 | A1 | 5/2010 | Bandholz et al. |
| 2011/0073359 | A1 | 3/2011 | Cases et al. |
| 2011/0108972 | A1 | 5/2011 | Foster et al. |
| 2011/0109381 | A1 | 5/2011 | Foster, Sr. et al. |
| 2011/0110064 | A1 | 5/2011 | Foster, Sr. et al. |
| 2011/0110065 | A1 | 5/2011 | Foster, Sr. et al. |
| 2011/0148543 | A1 | 6/2011 | Bandholz et al. |
| 2011/0312129 | A1 | 12/2011 | Joseph et al. |
| 2011/0317387 | A1 | 12/2011 | Pan et al. |
| 2012/0069537 | A1 | 3/2012 | Rofougaran |
| 2012/0162947 | A1 | 6/2012 | O'Donnell et al. |
| 2012/0218024 | A1 | 8/2012 | Foster, Sr. et al. |
| 2012/0286431 | A1 | 11/2012 | Foster, Sr. et al. |
| 2013/0214855 | A1 | 8/2013 | Foster, Sr. et al. |

FOREIGN PATENT DOCUMENTS

| | | |
|---|---|---|
| JP | 6140451 A | 5/1994 |
| JP | 2000031651 A | 1/2000 |
| JP | 2008028188 | 2/2008 |
| KR | 20030084355 | 11/2003 |
| WO | WO2004/025695 A2 | 3/2004 |

OTHER PUBLICATIONS

Office Action, U.S. Appl. No. 12/617,169, Feb. 17, 2012, pp. 1-18.
Notice of Allowance, U.S. Appl. No. 12/617,169, Apr. 27, 2012, pp. 1-7.
Office Action, U.S. Appl. No. 12/274,407, May 24, 2011, pp. 1-9.
Notice of Allowance, U.S. Appl. No. 12/274,407, Sep. 29, 2011, pp. 1-11.
Office Action, U.S. Appl. No. 12/570,029, Oct. 20, 2011, pp. 1-9.
Office Action, U.S. Appl. No. 12/570,029, Dec. 15, 2011, pp. 1-11.
Notice of Allowance, U.S. Appl. No. 12/570,029, Apr. 6, 2012, pp. 1-8.
Office Action, U.S. Appl. No. 12/616,912, Feb. 3, 2012, pp. 1-10.
Office Action, U.S. Appl. No. 12/616,912, May 31, 2012, pp. 1-6.
Notice of Allowance, U.S. Appl. No. 12/616,912, Jul. 10, 2012, pp. 1-11.
Office Action, U.S. Appl. No. 12/617,273, Feb. 3, 2012 pp. 1-10.
Office Action, U.S. Appl. No. 12/617,273, May 31, 2012, pp. 1-7.
Notice of Allowance, U.S. Appl. No. 12/617,273, Jul. 9, 2012, pp. 1-10.
Office Action, U.S. Appl. No. 12/644,704, Apr. 3, 2012, pp. 1-6.
Breed, "Analyzing Signals Using the Eye Diagram", Nov. 2005, High Frequency Electronics, vol. 4 No. 11, pp. 50, 52, 53.
Office Action, U.S. Appl. No. 12/616,563, Aug. 6, 2012.
Office Action, U.S. Appl. No. 12/644,704, Aug. 31, 2012.
Black et al., "Die Stacking (3D) Microarchitecture", Proceedings of the 39th International Symposium on Microarchitecture, Dec. 2006, pp. 469-479, IEEE Computer Society, Washington, DC, USA.

* cited by examiner

```
┌─────────────────────────────────────────────────────────────────────────────┐
│ Transmit An Alternating Current Signal From A Substrate Through A First Die Of The Die Stack To │
│    Electronic Circuitry In A Second Die Of The Die Stack, The First Die Mounted Directly Upon The │
│ Substrate, The First Die Manufactured To Be Identical To The Second Die With A Plurality Of Through │
│  Silicon Vias ('TSVs'), The TSVs Connected Through Fuses To Electronic Circuitry On Each Die, The │
│   First Die Personalized By Blowing On The First Die A Number Of The Fuses, Converting The TSVs │
│       Previously Connected To Blown Fuses Into Pass-through Vias ('PTVs'), Each PTV Comprising A │
│     Conductive Pathway Through A Die With No Connection To Any Circuitry On The Die, The Second │
│    Die Mounted Upon The First Die With No Rotation And No Shift In Position With Respect To The First │
│    Die So That PTVs In The First Die Connect Signal Lines From The Substrate Through The First Die │
│                                   To TSVs In The Second Die │
│                                             302 │
└─────────────────────────────────────────────────────────────────────────────┘
                                                                              │
                                                                              ▼
┌──────────────────────────────────────────────────────┐    ┌──────────────────────────┐
│ Conduct, By The Second Die, The Signal Through Through │    │ Conduct, By The First │
│  TSVs In The Second Die To The Electronic Circuitry On The │    │ Die, The Signal Through │
│   Second Die, The Second Die Manufactured To Be Identical │◄───│  PTVs In The First Die To │◄──
│     To The First Die And Later Personalized By Blowing Fuses │    │  TSVs In The Second Die │
│          Connecting TSVs To Circuitry On The Second Die │    │            304 │
│                          306 │    └──────────────────────────┘
└──────────────────────────────────────────────────────┘

┌───────────────────────────────────────────────────────────────────────────────┐
│ Conduct The Signal Through An Interface Die Mounted Upon The Substrate Between The Substrate │
│   And The First Die, The Interface Die Splitting And Connecting A Same Set Of Signal Lines From The │
│           Substrate To The PTVs On The First Die And Separately To TSVs On The First Die │
│                                        308 │
└───────────────────────────────────────────────────────────────────────────────┘
  ┌──────────────────────────────┐  ┌────────────────────────────────────────────┐
  │ Multiplex And Demultiplex By │  │ Multiplex And Demultiplex By The Interface Die The Same │
  │  The Interface Die The Same │  │   Set Of Signal Lines From The Substrate To The PTVs On │
  │  Set Of Signal Lines From The │  │   The First Die And Separately To TSVs On The First Die, │
  │   Substrate To The PSVs On │  │  Including Operating By The Substrate The Signal Lines On │
  │ The First Die And Separately │  │  The Substrate At A First Clock Speed And Operating By The │
  │   To TSVs On The First Die, │  │  Interface Die Signal Lines To The PTVs And To The TSVs At │
  │    The Signal Lines On The │  │   A Second Clock Speed, The First Clock Speed Sufficiently │
  │ Substrate, To The PTVs, And │  │    Faster Than The Second Clock Speed To Fit Onto The │
  │  To The TSVs All Operating At │  │   Signal Lines Of The Interface Die All Communications │
  │       A Same Clock Speed │  │     Between The Substrate And The PTVs And The TSVs │
  │              310 │  │                        312 │
  └──────────────────────────────┘  └────────────────────────────────────────────┘
```

FIG. 7

Transmit An Alternating Current Signal From A Substrate 302

Transmit The Signal Through A First Substack Of The Die Stack To Electronic Circuitry In A Second Substack Of The Die Stack, The First Die Substack Mounted Upon The Substrate, The First Substack Comprising Two Or More Dies Manufactured To Be Identical To Dies In A Second Die Substack With A Number Of TSVs, The TSVs Connected Through Fuses To A Same Circuit On Each Of The Dies Of The First Substack, The Dies Of The First Substack Personalized By Blowing On The Dies Of The First Substack A Number Of Same Fuses In Each Die Of The First Substack, Converting The TSVs Previously Connected Through The Blown Fuses Into PTVs, Each PTV Comprising A Conductive Pathway Through A Die With No Connection To Any Circuitry On The Die, Each Of The Dies In The First Substack Stacked Directly Upon One Another With No Rotation And No Shift In Position With Respect To One Another
314

Conduct The Signal Through PTVs 304

Conduct, By The First Die Stack, The Signal Through PTVs Of The First Die Stack To TSVs In The Second Die
316

Conduct The Signal Through TSVs To The Electronic Circuitry 306

Conduct The Signal Through Through TSVs Further Comprises Conducting, By The Second Substack, The Signals Through TSVs Of The Second Substack To The Electronic Circuitry In The Second Substack, The Second Substack Comprising Dies Manufactured To Be Identical To The Dies Of The First Substack And Later Personalized By Blowing Same Fuses In Each Of The Dies Of The Second Substack, Each Of The Dies In The Second Substack Stacked Directly Upon One Another With No Rotation And No Shift In Position With Respect To One Another, The Second Substack Mounted Upon The First Substack So That The PTVs In The First Substack Connect Conductors From The Substrate Through The First Substack To TSVs In The Second Substack
318

FIG. 8

INTEGRATED CIRCUIT DIE STACKS HAVING INITIALLY IDENTICAL DIES PERSONALIZED WITH FUSES AND METHODS OF MANUFACTURING THE SAME

CROSS-REFERENCE TO RELATED APPLICATION

This application is a continuation of co-pending U.S. application Ser. No. 12/616,912, filed on Nov. 12, 2009, herein incorporated by reference.

BACKGROUND OF THE INVENTION

1. Field of the Invention

The field of the invention is design, fabrication, and operation of integrated circuits, or, more specifically, structure and methods of making and operating integrated circuit die stacks having initially identical dies personalized with fuses.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas of computer technology that sees continual advancement is packaging of integrated circuits. Packaging many integrated circuits into a confined space is becoming more difficult as many devices continue to shrink in size or need to communicate with more chips. An example would be stacking multiple memory chips in one package to provide more locations to store data. Prior art has shown how to stack multiple chips on top of each other with package stacking, one die per package. Other prior art has shown how to stack multiple dies into one package by tying signal lines together between or among dies within the package, for example, wrapping signal lines outside the dies, or placing redistribution layers between the dies. A more recent approach for wafer stacking is to connect the signals together with vias, effectively sending a bus of signal lines vertically through a stack of dies. All of these approaches have the drawback of more heavily loading busses as more dies are stacked reducing signal quality and bus speeds.

SUMMARY OF THE INVENTION

Integrated circuit die stacks having initially identical dies personalized with fuses, methods of making such die stacks, and methods of operating such die stacks, including a first die mounted upon a substrate, the first die manufactured to be initially identical to a second die with a plurality of through silicon vias ('TSVs'), the TSVs connected through fuses to electronic circuitry on the first die, the first die personalized by blowing on the first die a number of the fuses, converting the TSVs previously connected through the blown fuses into pass-through vias ('PTVs'), each PTV implementing a conductive pathway through the first die with no connection to any circuitry on the first die; and the second die, manufactured to be initially identical to the first die and later personalized by blowing fuses connecting TSVs to circuitry on the second die, the second die mounted upon the first die so that the PTVs in the first die connect signal lines from the substrate through the first die to TSVs in the second die, each TSV on the second die implementing a conductive pathway through the second die that is also connected to electronic circuitry on the second die.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIGS. 7-8 set forth flow charts illustrating example methods of operation for an integrated circuit die stack according to embodiments of the present invention.

DETAILED DESCRIPTION OF EXEMPLARY EMBODIMENTS

Figure 1:
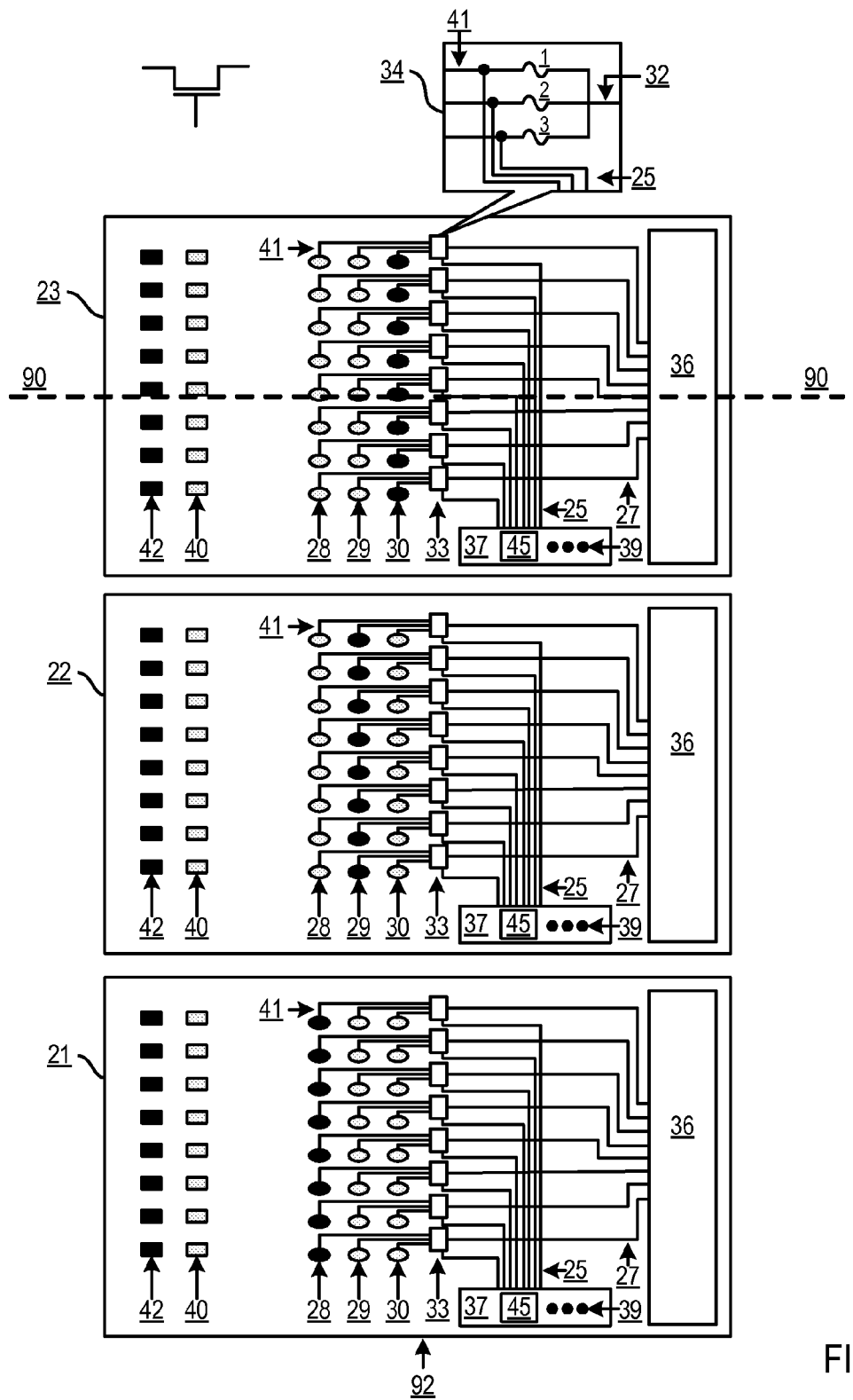
FIG. 1 sets forth a cross-sectional plan view schematic drawing of three example integrated circuit dies of a die stack according to embodiments of the present invention.

Examples of integrated circuit die stacks, methods of manufacturing integrated circuit die stacks, and methods of operation for integrated die stacks according to embodiments of the present invention are described with reference to the accompanying drawings, beginning with FIG. 1. FIG. 1 sets forth a cross-sectional plan view schematic drawing of three example integrated circuit dies (21, 22, 23) of a die stack according to embodiments of the present invention. As an aid to explanation, the dies in the example of FIG. 1 are illustrated unstacked, laid beside one another in the plane of the illustration. A die stack can be formed of these dies by mounting the dies directly upon one another with no rotation and no shift in position with respect to one another, die (22) on die (21) and die (23) on die (22), and then mounting all three dies onto a substrate. The substrate can be a connective layer in a chip package between the die stack and external pins or between flip-chip connectors and the stack. In various embodiments the substrate can be a board, an integrated circuit carrier board, an adapter board, or a motherboard, for example. The substrate can be composed of plastic, phenolic, ceramic, composite, and other materials as may occur to those of skill in the art. The substrate will typically contain disposed within or upon it conductors, electrical buses, for example, including power, common, and signal lines connecting to power, common, signal lines in the dies of a die stack.

Each die (21, 22, 23) in the example of FIG. 1 is manufactured to be initially identical to each of the other dies. "Initially identical" means that each die as manufactured with other dies on a silicon wafer is identical, although the dies are personalized with blown fuses after initial manufacture. The term 'manufacture' as used here refers to the initial stage of manufacture of a die with other dies on a silicon wafer or the like, rather than the overall process of manufacture in a larger sense. In such a larger sense, 'manufacture' could refer to the process of stacking dies on a substrate, packing the dies, blowing the fuses in the dies to create a large integrated circuit in a chip package, on a board, or the like, and so on. But that is not the way the term 'manufacture' is used. Here 'manufacture' refers only the initial stage of fabricating identical dies—before the dies are personalized in any way. The three dies in the example of FIG. 1 are illustrated as identical in every way, except for the black/gray color indicators for personalized conductive pathways, PTVs and TSVs (28, 29, 30).

Each die in the example of FIG. 1 is initially manufactured with a number of through silicon vias ('TSVs') connected through fuses (33) to electronic circuitry on each die (36). The electronic circuitry (36) is the main circuitry for carrying out the processing tasks for which each integrated circuit die is designed, containing many transistors, resistors, capacitors, logic gates, latches and flip-flops, counters, other registers, and so on. Each TSV is a conductive pathway through a die, conductive pathways which when stacked on other dies form conductive pathways vertically through the die stack down to bus conductors in a substrate, connecting bus signals up through the dies in the die stack. Each such vertical conductive pathway (28, 29, 30) through a die is initially manufactured as a TSV, that is, connected (41) to circuitry (36) on the die through fuses (33). In this specification, a pass-through via ('PTV') is defined as a conductive pathway, that is, a vertical conductive pathway, through a die not connected to the circuitry on the die. Thus PTVs are distinguished from TSVs which are connected to the electronic circuitry on a die. PTVs in a die connect conductors from a substrate to another die higher in the stack. TSVs in a die connect conductors to circuitry on that die directly from a substrate or from other dies lower in the stack.

The dies (21, 22, 23) in the example of FIG. 1 also include power lines (40) and common lines (42), which like the PTVs and the TSVs are also vertical conductive pathways through the dies. Readers will recognize, although the connections are not shown, that like TSVs, the power and common lines are typically connected to circuitry. In addition, the power lines and common lines, also like TSVs, are initially manufactured disposed on all dies so as to connect conductors, in this case power and common lines, from a substrate up through stacked dies. In the particular example of FIG. 1, with die (22) stacked on die (21), the power lines (40) and the common lines (42) of die (22) align with the power lines (40) and the common lines (42) of die (21), and the power lines (40) and the common lines (42) of die (23) align with the power lines (40) and the common lines (42) of die (22) when die (23) is stacked on die (22). In this way, power and common are conducted from a substrate all the way up through a die stack with no need for any power or common bus connections external to the die stack.

After initial manufacture, each die, initially manufactured as identical to other dies, is personalized by blowing one or more of the fuses connecting the vertical conductive pathways (28, 29, 30), thereby converting some of the vertical conductive pathways from TSVs into PTVs. For ease of explanation, the term 'fuse' is used throughout this specification, but readers of skill in the art will recognize that fuses used to personalize an integrated circuit will often, if not always, in fact be 'efuses.' An efuse is an element of an integrated circuit designed to undergo electromigration when exposed to a certain level of programming voltage and change the resistance of the circuit element from a low resistance to a high resistance, allowing a sensing circuit to sense the element as 'on,' 'programmed,' or 'blown.' During the life cycle of an integrated circuit, unblown efuses may be blown to configure and control access to scan circuitry and operational logic of an integrated circuit, for example. Efuses are often used to personalize integrated circuit dies for use in die stacks, for example, after the silicon masking and fabrication process.

Each of the boxes indicated by reference (33) are actually a set of three fuses (1, 2, 3) as indicated by the expanded detail in box (34). Each conductor (41) connects one of the vertical conductive pathways (28, 29, 30), TSVs or PTVs, to one of the fuses (1, 2, 3). The process of blowing the fuses is carried out in these example embodiments by fuse blowing logic (37) installed on the dies themselves, in this example, and connected to the fuses by fuse blowing buses (25). Each fuse blowing bus (25), shown here in horizontal cross-section as a single line, is actually a three-conductor bus, one conductor for each fuse in a set, as shown at reference (25) in the expansion box (34). The fuse blowing logic, a circuit module, actually present on the dies as shown in this example is not a requirement of the present invention because fuse blowing apparatus could be provided off the dies, connected to the dies by a peripheral interconnection such as a JTAG or IEEE 1149.1 network, for example. In this example, the fuse blowing logic in each die is provided with a stack position, information indicating to each die in a stack that die's position in the stack, typically with the position indicated as an integer in the range beginning with '1' for the first die in the stack, that is, the die mounted directly on a substrate, and another integer equal to the total number of identical dies in a stack. The fuse blowing logic blows a subset of fuses in dependence upon the stack position of the die in which each instance of fuse blowing logic is installed. Which subset of fuses is to be blown by the fuse blowing logic in any particular die is configured into each die at the time of manufacture as data, hardwired or in non-volatile memory, as a fuse blowing configuration (45). Such a fuse blowing configuration can be implemented as illustrated, for example, in Table 1.

TABLE 1

| Fuse Blowing Configurations | |
| --- | --- |
| Stack Position | Fuses To Blow |
| 1 | 2, 3 |
| 2 | 1, 3 |
| 3 | 1, 2 |

Each record of Table 1 represents a configuration of fuses to be blown by fuse blowing logic in a die in the stack position indicated by values in the left column of the table. Readers will recognize that the table structure is an example data structure used here only for convenient explanation of the association between stack position and indications of fuses to blow—and not as a limitation of the invention. Such associations of stack position and indications of fuses to blow can be implemented in a variety of data structures, including, for example, linked lists, arrays, C-style 'structs,' and so on. In all the examples in this specification, stack position 1 is taken as the bottom die in a stack, the die mounted directly on a substrate. According to the fuse blowing configurations of Table 1, therefore, fuse blowing logic (37) in a die in stack position 1 is instructed to blow fuses 2 and 3, therefore converting TSVs at references (29, 30) to PTVs, leaving the conductors at reference (28) TSVs as they were initially manufactured. Similarly, the fuse blowing configurations of Table 1 instruct fuse blowing logic (37) in a die in stack position 2 to blow fuses 1 and 3, therefore converting TSVs at references (28, 30) to PTVs, leaving the conductors at reference (29) TSVs as they were initially manufactured. And the fuse blowing configurations of Table 1 instruct fuse blowing logic (37) in a die in stack position 3 to blow fuses 1 and 2, therefore converting TSVs at references (28, 29) to PTVs, leaving the conductors at reference (30) TSVs as they were initially manufactured. This is actually the pattern illustrated in FIG. 1, with:

black ovals at reference (28) in die (21) indicating remaining TSVs and the light gray ovals (29, 30) indicating PTVs created by blowing fuses 2 and 3 on die (21), black ovals at reference (29) in die (22) indicating remaining TSVs and the light gray ovals (28, 30) indicating PTVs created by blowing fuses 1 and 3 on die (22), and black ovals at reference (30) in die (23) indicating remaining TSVs and the light gray ovals (28, 29) indicating PTVs created by blowing fuses 1 and 2 on die (23).

Each instance of fuse blowing logic in the example of FIG. 1 is also configured with a set of vertical conductors (39), forming a vertical bus among instances of fuse blowing logic in stacked dies, and supporting communications regarding fuse blowing among a substrate and dies in a stack. Information that can be transmitted up through the vertical bus (39) among instances of fuse blowing logic includes an instruction to blow fuses, the stack position of the first die in the stack, and the number of dies in the stack. The instruction to blow fuses can be delivered directly from automation in a substrate, either when power is first applied to the die stack or every time the die stack is powered on; through a substrate from automation outside the substrate; from peripheral interconnections when a die stack is fabricated; from an operating system of a computer in which a die stack is installed, for example as part of a power-on self test, either when power is first applied to the die stack or every time the computer is powered on; and in other ways as may occur to those of skill in the art. Instructing the die stack to blow fuses every time the die stack is powered on, although probably not exactly preferred, is harmless, because it is harmless to blow fuses that have already been blown.

An example of a method of fuse blowing is for the fuse blowing logic, upon receiving an instruction to blow fuses, to receive also its die's stack position. The fuse blowing logic can receive a stack position from the substrate or from a die lower in the stack through bus (39) as part of or in conjunction with an instruction to blow fuses. Then the fuse logic can carry out a process of blowing fuses by looking up its fuse blowing configuration with its stack position in, for example, Table 1, and then blowing the fuses indicated by the "Fuses To Blow" column in the table. After the fuse logic in a stack position blows its fuses, the fuse logic increments the stack position and sends the instruction to blow fuses and the incremented stack position through bus (39) to the fuse blowing logic in the next higher die in the stack. The fuse blowing logic in the top die can increment the stack position and transmit the instruction to blow fuses and the incremented stack position upward through bus (39), despite the fact the instruction to blow fuses will have no effect when issued from the top die, exercising the algorithm because it must if all the dies are to be manufactured as identical. Alternatively, bus (39), in addition to the instruction to blow fuses and the stack position, can also carry an indication of the number of dies in the stack, so that the fuse blowing algorithm in the fuse blowing logic in each die identically also retrieves its fuse blowing configuration, blows the fuses, compares the stack position to the number of dies in the stack, and transmits information upward only if the value of the current stack position is less than the number of dies in the stack. In this way, the fuse blowing logic in the top die would not try to transmit anything upward after blowing its fuses.

This specification just described two fuse blowing procedures or algorithms, one that operates without knowing the number of dies in the stack and another that operates in dependence upon the number of dies in the stack. A third method of blowing fuses would be for fuse blowing logic in each die to increment the stack position before retrieving a fuse configuration, blowing fuses, and passing the value of the stack position to the next die in the stack. In such a method, the source of the instruction to blow fuses and the first value of the stack position is configured to provide to the first die in the stack the initial value of the stack position as '0.' Methods of fuse blowing that first increment stack position can be adapted to operate with or without the parameter of the number of dies in the stack, so that this specification now discloses four methods of fuse blowing. In addition, in implementations of die stacks that may be installed in environments likely to instruct the die stack to blow fuses every time a die stack is powered on, a fuse blowing procedure can include the steps of sensing whether fuses have already been blown and determining whether to blow fuses in dependence upon whether the fuses have already been blown, with or without the parameter of the number of dies in the stack, thereby bringing this specification's count of methods of fuse blowing up to six. It is likely that persons of skill in the art will think of other procedures for blowing fuses, and all such procedures are well within the scope of the present invention.

Figure 2:
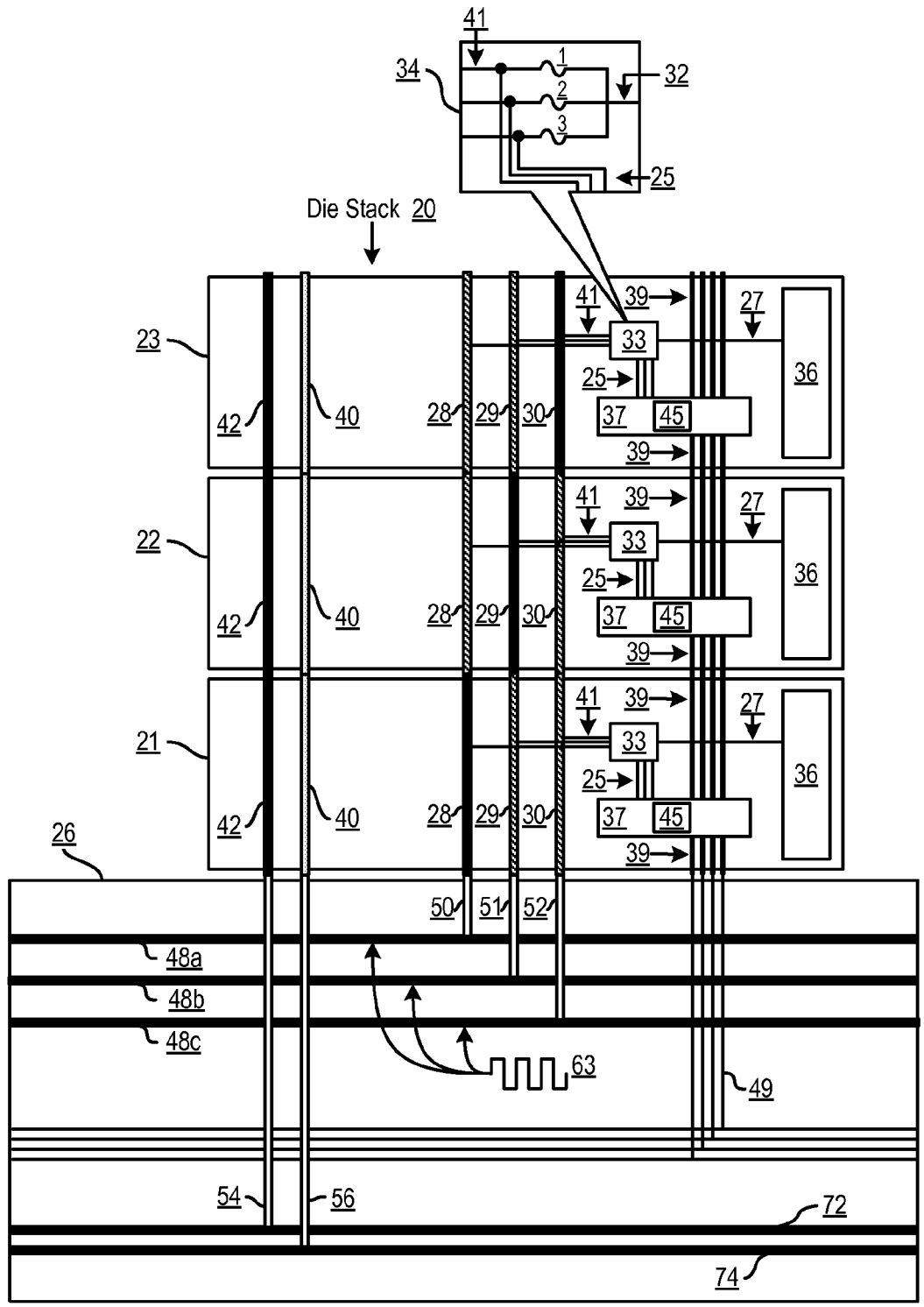
FIGS. 2-5 set forth cross-sectional vertical view schematic drawings of further example integrated circuit die stacks according to embodiments of the present invention.

For further explanation, FIG. 2 sets forth a cross-sectional vertical view schematic drawing of an example integrated circuit die stack (20) according to embodiments of the present invention. FIG. 2 shows the dies (21, 22, 23) of FIG. 1 stacked upon one another and upon a substrate (26)—with the cross-section of FIG. 2 taken along line (90) on FIG. 1 and viewed from perspective (92) on FIG. 1. The substrate includes conductors represented here as signal lines (48a, 48b, 48c), power lines (74), and common lines (72). The signal lines (48a, 48b, 48c), viewed here as a single horizontal line because of the cross-sectional perspective, in fact represent a plurality of bus conductors, eight (to match the number of TSVs in the dies of FIG. 1), or, alternatively, sixteen, thirty-two, sixty-four, and so on. Each die in this example includes PTVs shown as cross hatched vertical bars at references (29, 30) on die (21), (28, 30) on die (22), (28, 29) on die (23), vertical conductive pathways through a die with no connections to any circuitry on the die. Each die also includes TSVs shown as solid black vertical bars at references (28) on die (21), (29) on die (22), (30) on die (23), again, conductive pathways through a die that also connect to electronic circuitry (36) on a die. The substrate (26) provides connections (50, 51, 52) from the signal lines (48a, 48b, 48c) in the substrate through TSVs to circuitry (36) on the dies. In addition, the substrate's signal lines connect to the TSVs (29) in the second die (22) through PTVs (29) in the first die (21), and the substrate's signal lines also connect to the TSVs (30) in the third die (23) through PTVs (30) in the first die (21) and the second die (22). As mentioned, the substrate (26) can be a connective layer in a chip package between the die stack and external pins or between flip-chip connectors and the stack. In various embodiments the substrate can be a board, an integrated circuit carrier board, an adapter board, or a motherboard, for example. The substrate can be composed of plastic, phenolic, ceramic, composite, and other materials as may occur to those of skill in the art. The substrate will typically contain disposed within or upon it conductors, electrical buses, for example, including power, common, and signal lines connecting to power, common, signal lines in the dies of a die stack.

Each die (21, 22, 23) in the example of FIG. 2 is manufactured to be initially identical to each of the other dies, and the three dies in the example of FIG. 2 are illustrated as identical in every way, except for the black/cross hatched color indicators for personalized conductive pathways, PTVs and TSVs (28, 29, 30). Each die in the example of FIG. 1 is initially manufactured with a number of TSVs connected through fuses (33) to electronic circuitry on each die (36). Each vertical conductive pathway (28, 29, 30) through a die is initially manufactured as a TSV, that is, connected (41) to circuitry (36) on the die through fuses (33).

The dies (21, 22, 23) in the example of FIG. 2 also include power lines (40) and common lines (42), which like the PTVs and the TSVs are also vertical conductive pathways through the dies. The power lines and common lines are manufactured disposed on all dies so as to connect conductors, in this case power and common lines from a substrate, up through stacked dies. In the particular example of FIG. 2, with die (22) stacked on die (21), the power lines (40) and the common lines (42) of die (22) align with the power lines (40) and the common lines (42) of die (21), and the power lines (40) and the common lines (42) of die (23) align with the power lines (40) and the common lines (42) of die (22) when die (23) is stacked on die (22). In this way, power (74) and common (72) are conducted (54, 56) from a substrate (26) all the way up through a die stack (20) with no need for any power or common bus connections external to the die stack.

After initial manufacture, each die, initially manufactured as identical to other dies, is personalized by blowing one or more of the fuses connecting the vertical conductive pathways (28, 29, 30), thereby converting some of the vertical conductive pathways from TSVs into PTVs. Each of the boxes indicated by reference (33) are actually a set of three fuses (1, 2, 3) as indicated by the expanded detail in box (34). Each conductor (41) connects one of the vertical conductive pathways (28, 29, 30), TSVs or PTVs, to one of the fuses (1, 2, 3). The process of blowing the fuses is carried out in these example embodiments by fuse blowing logic (37), a circuit module installed on the dies themselves, in this example, and connected to the fuses by a fuse blowing bus (25). In this example, the fuse blowing logic in each die is provided with a stack position, information indicating to each die in a stack that die's position in the stack, typically with the position indicated as an integer in the range beginning with '1' for the first die in the stack, that is, the die mounted directly on a substrate, and another integer equal to the total number of identical dies in a stack. The fuse blowing logic blows a subset of fuses in dependence upon the stack position of the die in which each instance of fuse blowing logic is installed. Which subset of fuses is to be blown by the fuse blowing logic in any particular die is configured into each die at the time of manufacture as data, hardwired or in non-volatile memory, as a fuse blowing configuration (45). Such a fuse blowing configuration can be implemented as illustrated, for example, in Table 1 above.

As described above, each record of Table 1 represents a configuration of fuses to be blown by fuse blowing logic in a die in the stack position indicated by values in the left column of the table. According to the fuse blowing configurations of Table 1, fuse blowing logic (37) in a die in stack position 1 is instructed to blow fuses 2 and 3, therefore converting TSVs at references (29, 30) to PTVs, leaving the conductors at reference (28) TSVs as they were initially manufactured. Similarly, the fuse blowing configurations of Table 1 instruct fuse blowing logic (37) in a die in stack position 2 to blow fuses 1 and 3, therefore converting TSVs at references (28, 30) to PTVs, leaving the conductors at reference (29) TSVs as they were initially manufactured. And the fuse blowing configurations of Table 1 instruct fuse blowing logic (37) in a die in stack position 3 to blow fuses 1 and 2, therefore converting TSVs at references (28, 29) to PTVs, leaving the conductors at reference (30) TSVs as they were initially manufactured. This is actually the pattern illustrated in FIG. 2, with:

- a black bar at reference (28) in die (21) indicating remaining TSVs and the cross-hatched bars (29, 30) indicating PTVs created by blowing fuses 2 and 3 on die (21),
- a black bar at reference (29) in die (22) indicating remaining TSVs and the cross-hatched bars (28, 30) indicating PTVs created by blowing fuses 1 and 3 on die (22), and
- a black bar at reference (30) in die (23) indicating remaining TSVs and the cross-hatched bars (28, 29) indicating PTVs created by blowing fuses 1 and 2 on die (23).

Each instance of fuse blowing logic in the example of FIG. 2 is also configured with a set of vertical conductors (39), forming a vertical bus among instances of fuse blowing logic in stacked dies, and supporting communications regarding fuse blowing among a substrate and dies in a stack. The substrate (26) in this example is configured with a fuse blowing control bus (49) connected to the in-die bus (39) to communicate information regarding fuse blowing. Information regarding fuse blowing that can be transmitted up through the vertical bus (39) among instances of fuse blowing logic includes an instruction to blow fuses, the stack position of the first die in the stack, and the number of dies in the stack. As noted earlier, the instruction to blow fuses can be delivered directly from automation in a substrate, through a substrate from automation outside the substrate, from peripheral interconnections when a die stack is fabricated, from an operating system of a computer in which a die stack is installed, and in other ways as may occur to those of skill in the art. In addition, this specification describes above with regard to FIG. 1 six methods of blowing fuses when fuse blowing logic receives an instruction to do so and noted that all such methods of fuse blowing, as well as others that may occur to persons of skill in the art, are well within the scope of the present invention.

Figure 3:
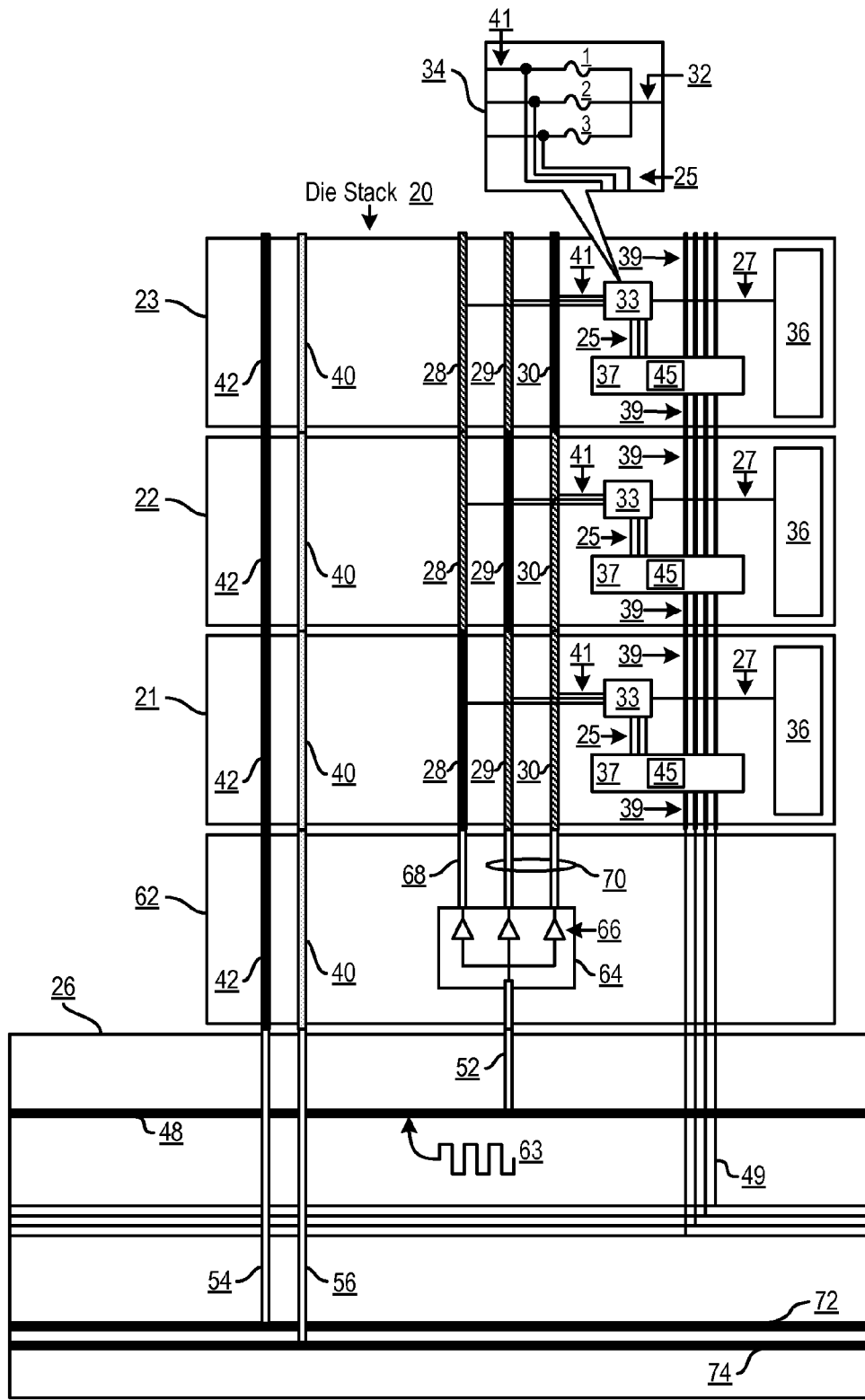

For further explanation, FIG. 3 sets forth a cross-sectional vertical view schematic drawing of a further example integrated circuit die stack according to embodiments of the present invention, where the die stack (20) includes an interface die (62). FIG. 3 shows the dies (21, 22, 23) of FIGS. 1-2 stacked upon a substrate (26) similar to the substrate (26) of FIG. 2—with the cross-section of FIG. 3 taken along line (90) on FIG. 1 and viewed from perspective (92) on FIG. 1. The example die stack of FIG. 3, however, unlike the die stack of FIG. 2, includes an additional die, an interface die (62) mounted upon the substrate (26) between the substrate (26) and the first die (21).

The interface die (62) provides an interface between the other dies (21, 22, 23) in the stack (20) in the sense that the interface die splits and connects a same set of signal lines (48) from the substrate to the PTVs (29, 30) on the first die (21) in the stack and separately to TSVs (28) on the first die (21). PTVs (29) on the first die (21) then convey signals from the substrate through TSVs (29) of the second die (22) to circuitry (36) on the second die (22)—and PTVs (30) on the first die (21) convey signals from the substrate through PTVs (30) of the second die (22) and through TSVs (30) of the third die (23) to circuitry (36) on the third die (23). The splitting of signals in the interface die (62) is effected by interface circuitry (64) in the interface die (62). The interface circuitry includes drivers (66) that connect the signal lines (48) from the substrate to signal lines (68, 70) in the interface die. The drivers (66) are depicted pointing up through the stack in a unidirectional manner, but readers will recognize that the interface circuitry

(64) can be configured to operate the conductors (52, 68, 70) either unidirectionally or bidirectionally. The signal lines (68) connect driver outputs to TSVs (28) in the first die (21) and therefore through fuses (33) to electronic circuitry (36) in the first die, and the signal lines (70) connect driver outputs to PTVs (29, 30) in the first die (21) and therefore to TSVs (29) and circuitry (36) in the second die (22), and through PTVs (30) in the second die (22) to TSVs (30) and circuitry (36) in the third die (23). The drivers (66) are depicted pointing up through the stack in a unidirectional manner, but readers will recognize that the interface circuitry (64) can be configured to operate the conductors (52, 68, 70) either unidirectionally or bidirectionally.

In view of this explanation of the example die stack of FIG. 3, readers will note that the substrate (26) of FIG. 3, unlike the substrate (26) under the die stack of FIG. 2, with the inclusion of the interface circuitry (64) of the interface die in the die stack, has only one signal bus (48) and drives only a single bus connection (52) into the die stack despite the fact that three signal buses rise through the three dies (21, 22, 23) in the stack. This is a design and manufacturing advantage over the substrate of FIG. 2 which drives three signal buses into the die stack from three separate signal buses (48a, 48b, 48c) in the substrate, one set of bus lines into the TSVs (28) of die (21), another set of bus lines into the PTVs (29) of die (21), and a third set of bus lines into the PTVs (30) of die (21). This is an engineering tradeoff, the cost of adding an interface die to the stack against the cost of manufacturing a more complex substrate. It is likely that embodiments with more sets of PTVs and TSVs and therefore more buses driven into the die stack will tend to prefer the use of an interface die.

Figure 4:
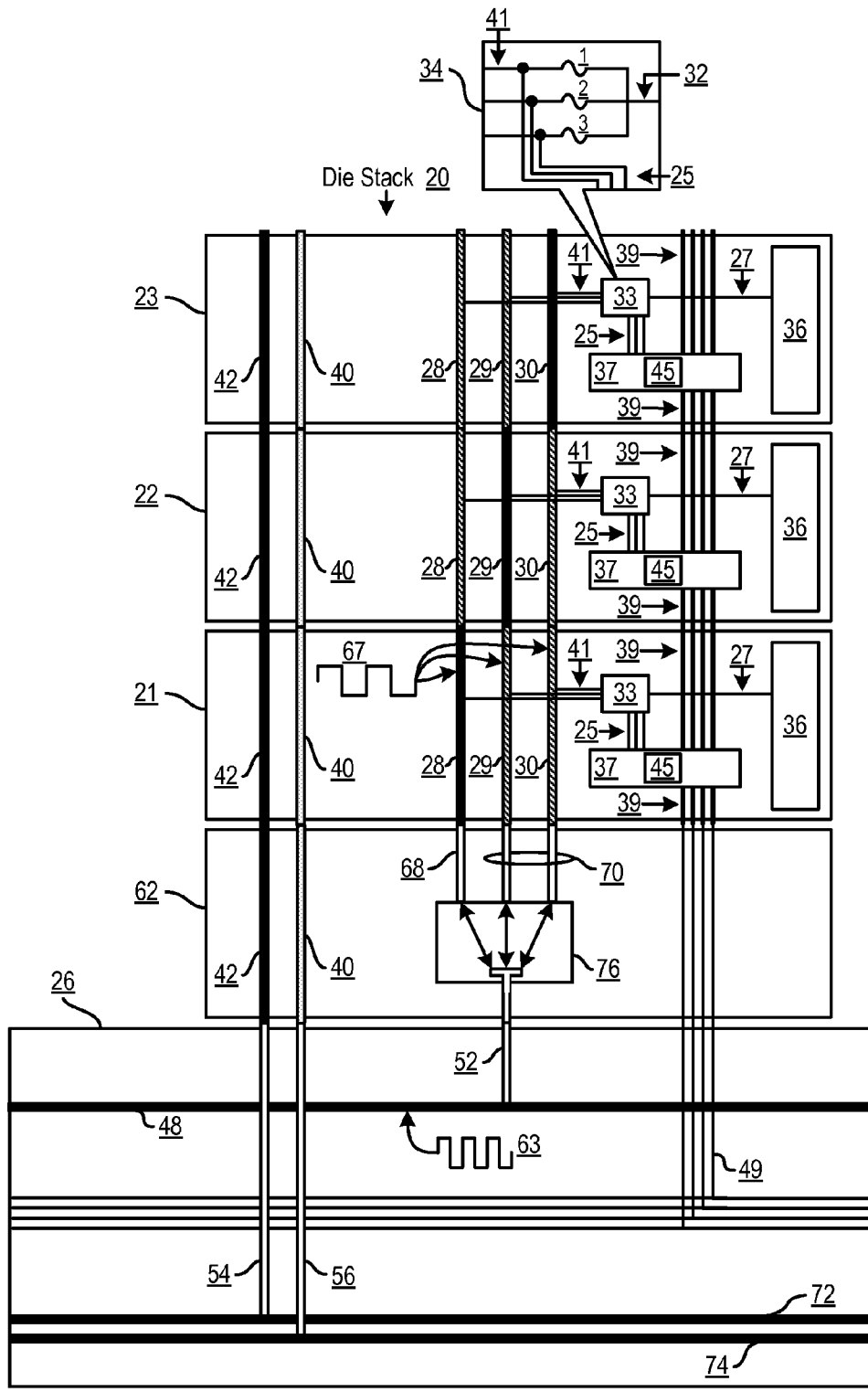

For further explanation, FIG. 4 sets forth a cross-sectional vertical view schematic drawing of a further example integrated circuit die stack according to embodiments of the present invention, where the die stack (20) includes an interface die (62). FIG. 4 shows the dies (21, 22, 23) of FIGS. 1-2 stacked upon a substrate (26) like the substrate (26) of FIG. 3—with only one signal bus (48) in the substrate—with the cross-section of FIG. 4 taken along line (90) on FIG. 1 and viewed from perspective (92) on FIG. 1. The example die stack of FIG. 4, also like the die stack of FIG. 3, includes an interface die (62) mounted upon the substrate (26) between the substrate (26) and the first die (21) in the die stack (20).

The interface die (62) in the example of FIG. 4 provides an interface between the other dies (21, 22, 23) in the stack in the sense that the interface die multiplexes and demultiplexes the same set of signal lines (48) from the substrate (26) to the PTVs (29, 30) on the first die (21) and separately to TSVs (28) on the first die (21). PTVs (29) on the first die (21) then convey signals from the substrate through TSVs (29) of the second die (22) to circuitry (36) on the second die (22)—and PTVs (30) on the first die (21) convey signals from the substrate through PTVs (30) of the second die (22) and through TSVs (30) of the third die (23) to circuitry (36) on the third die (23). The multiplexing and demultiplexing of signals in the interface die (62) is carried out by mux/demux circuitry (76) in the interface die (62). The mux/demux circuitry (76) connects the signal lines (48) from the substrate to signal lines (68, 70) in the interface die. The signal lines (68) connect driver outputs to TSVs (28) in the first die (21) and therefore through fuses (33) to electronic circuitry (36) in the first die, and the signal lines (70) connect driver outputs to PTVs (29, 30) in the first die (21) and therefore to TSVs (29) and circuitry (36) in the second die (22), and through PTVs (30) in the second die (22) to TSVs (30) and circuitry (36) in the third die (23).

Alternating current signals on the signal lines (48, 52, 68, 70) are typically characterized by a clock speed. The interface die (62) can optionally operate the signal lines (68, 70) to the PTVs (29, 30) and the TSVs (28) in the first die (21) at the same clock speed as the signal lines (48) in the substrate—although such a design would potentially leave the identical dies (21, 22, 23) operating with unused data communications bandwidth. As a possibly preferred alternative, therefore, the substrate can be configured to operate the signal lines (48) of the substrate at a first clock speed (63) with the interface die (62) operating signal lines (68, 70) to the PTVs and the TSVs at a second clock speed (67), the first clock speed sufficiently faster than the second clock speed to fit onto the signal lines (68, 70) of the interface die all communications between the substrate and the PTVs and the TSVs. In a case where, for example, the clock speed of the signal lines (48) in the substrate (26) were 1.5 GHz and the clock speed of the signals on the signal lines (68, 70) in the interface die (62) were 0.5 GHz—and the mux/demux circuitry (76) administers packets of data from the substrate, sending one third of the packets to each die (21, 22, 23) for processing—then with these two example clock speeds, data communications from the substrate to the dies would exactly fit the bandwidth of the data communications speed available between the interface die and the other dies in the stack, thereby reducing or eliminating completely any need for buffering in the mux/demux circuitry (76) or elsewhere in the interface die (62)—and also eliminating any need to increase bandwidth in the substrate by adding additional signal bus lines, like (48b, 48c) on FIG. 2.

Figure 5:
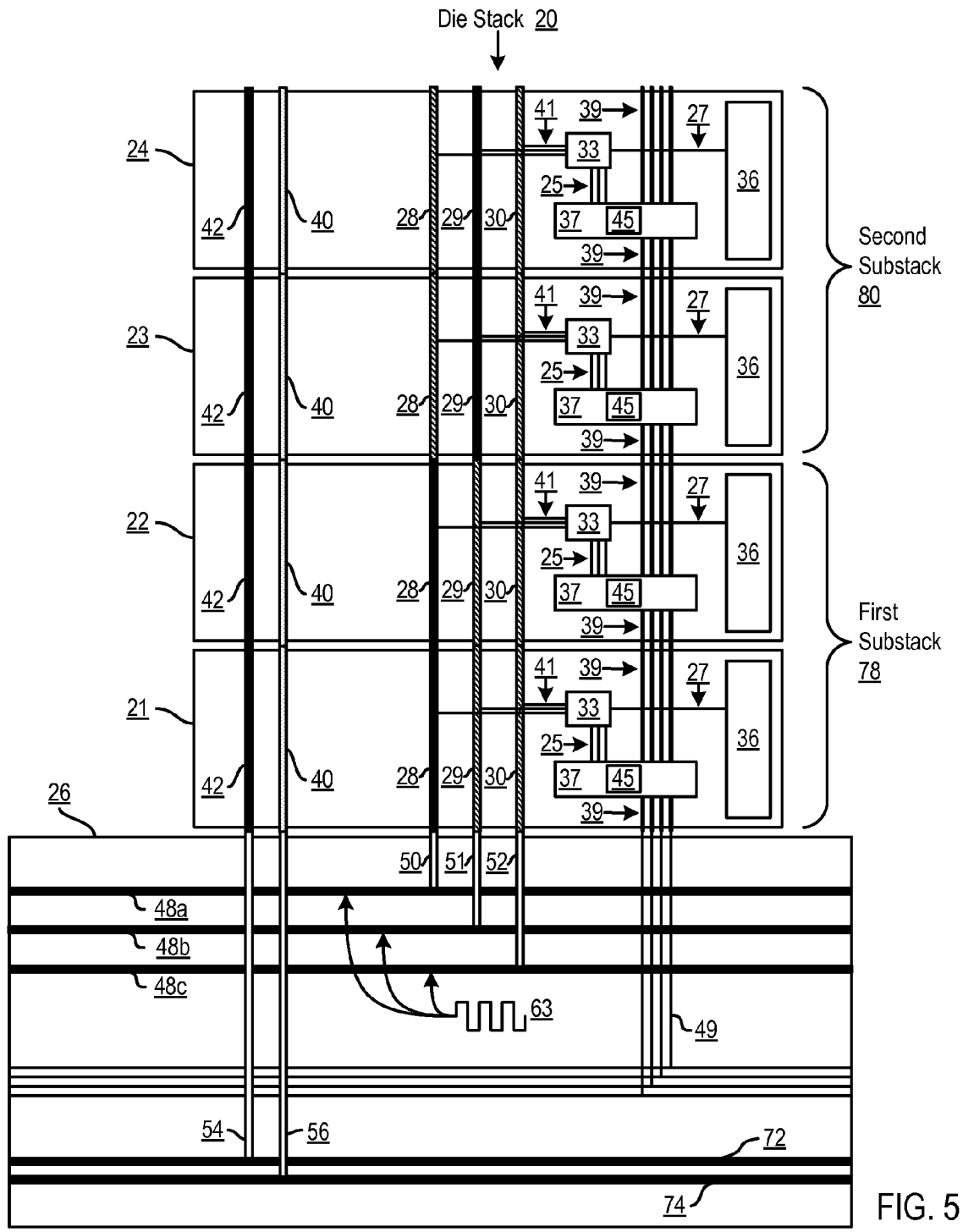

For further explanation, FIG. 5 sets forth a cross-sectional vertical view schematic drawing of a further example integrated circuit die stack (20) according to embodiments of the present invention, where the die stack (20) includes substacks (78, 80). FIG. 5 shows dies like the dies (21, 22, 23) of FIG. 1, manufactured to be initially identical to one another and to dies in other substacks, stacked upon a substrate (26) like the substrate (26) of FIG. 2—with the cross-section of FIG. 5 taken along line (90) on FIG. 1 and viewed from perspective (92) on FIG. 1. In the example die stack of FIG. 5, however, the stacked dies are organized as two substacks, including a first substack (78) mounted upon the substrate (26), with the first substack including two or more (in this example, only two) identical dies (21, 22), identical not only in original manufacture but also identical in their pattern of blown fuses and therefore identical in the structure of their PTVs (29, 30) and TSVs (28). It is the same fuses blown in each die of a substack that defines a substack, distinguishing one substack from another substack because the dies in the other substack have a same pattern of blown fuses that is different from the pattern of fuses blown in the first substack. In the particular example of FIG. 5, the first die substack (78) is mounted directly upon the substrate (26), and the first substack includes TSVs (28) connected through fuses (33) to electronic circuitry (36) on each of the dies (21, 22) of the first substack. The dies (21, 22) of the first substack are personalized by blowing on the dies of the first substack a number of the same fuses in each die of the first substack, converting TSVs previously connected through the blown fuses into PTVs (29, 30), so that the PTVs (29, 30) in the dies (21, 22) of the first substack represent conductive pathways through the dies of the first substack with no connections to any circuitry in the dies of the first substack. The dies of the first substack are stacked directly upon one another, that is, die (22) is stacked upon die (21), with no rotation and no shift in position with respect to one another.

The example die stack (20) of FIG. 5 also includes a second substack (80) that includes two or more dies (in this example, exactly two) (23, 24) manufactured to the initially identical to one another and also initially identical to the dies (21, 22) in the first substack (78). The dies of the second substack are stacked directly upon one another, that is, die (24) is stacked upon die (23), with no rotation and no shift in position with respect to one another. In addition, the dies of the second substack are completely identical to one another, identical not only in original manufacture but also identical in their pattern of blown fuses and therefore identical in the structure of their PTVs (28, 30) and TSVs (29). That is, the dies (22, 24) of the second substack are personalized by blowing on the dies of the second substack a number of the same fuses in each die of the second substack, converting TSVs previously connected through the blown fuses into PTVs (28, 30), so that the PTVs (28, 30) in the dies (23, 24) of the second substack represent conductive pathways through the dies of the second substack with no connections to any circuitry in the dies of the second substack.

The entire second substack (80) is mounted upon the first substack (78) so that PTVs (29) in the first substack connect the signal lines (48b, 51) from the substrate (26) through the first substack (78) to TSVs (29) in the second substack (80), where the TSVs (29) in the second substack (80) drive active circuitry (36) in the dies (23, 24) of the second substack (80). Readers will recognize also that PTVs (30) in the first substack (78) connect conductors, that is, signal lines (48c, 52), to PTVs (30) in the second substack (80), through which signals could be conducted to a TSVs and circuitry in a third substack—if a designer or manufacturer were to install a third substack on top of the second substack (80). Similarly, identical dies with more than two sets of PTVs can support installation of even more substacks, enabling creation of integrated circuit stacks in integrated circuit packages with various bus structures through the die stacks, with no need to use external wiring to connect buses up through the dies stacks, with die stacks fabricated with completely identical dies fabricated on wafers of many, many identical dies—and later personalized with blown fuses according to embodiments of the present invention.

The process of blowing fuses in die stacks with substacks differs somewhat from the process of blowing fuses in die stacks without substacks in that the process of blowing fuses in die stacks with substacks uses the parameters of substack size and substack die position. The process of blowing the fuses in substacks, like fuse blowing without substacks, is still carried out in these example embodiments by fuse blowing logic (37) installed on the dies themselves and connected to the fuses (33) by fuse blowing buses (25).

The fuse blowing logic in each die, however, is provided with a substack position, information indicating to each die in a substack that die's substack position in the overall die stack, typically with the substack position indicated as an integer in the range beginning with '1' for the first substack in the die stack, that is, the substack mounted directly on a substrate, and another integer equal to the total number of identical dies in each substack. The fuse blowing logic blows a same subset of fuses in each die in a substack—in dependence upon the substack position of each instance of fuse blowing logic. Which subset of fuses is to be blown by the fuse blowing logic in any particular substack is configured into each die at the time of manufacture as data, hardwired or in non-volatile memory, as a fuse blowing configuration (45). Such a fuse blowing configuration can be implemented for the case of dies stacks with substacks as illustrated, for example, in Table 2.

TABLE 2

Fuse Blowing Configurations

| Substack Position | Fuses To Blow |
|---|---|
| 1 | 2, 3 |
| 2 | 1, 3 |
| 3 | 1, 2 |

Each record of Table 2 represents a configuration of fuses to be blown by fuse blowing logic in a die in the substack position indicated by values in the left column of the table. According to the fuse blowing configurations of Table 2, fuse blowing logic (37) in the dies in substack position 1 is instructed to blow fuses 2 and 3 in each of the dies in the substack, therefore converting TSVs at references (29, 30) to PTVs, leaving the conductors at reference (28) TSVs as they were initially manufactured. Similarly, the fuse blowing configurations of Table 2 instruct fuse blowing logic (37) in dies in stack position 2 to blow fuses 1 and 3, therefore converting TSVs at references (28, 30) to PTVs, leaving the conductors at reference (29) TSVs as they were initially manufactured. For ease of explanation, the example of FIG. 5 is illustrated with only two substack, but the fuse blowing configuration of Table 2 is the actual pattern illustrated in FIG. 1, with:

black bars at reference (28) in the dies (21, 22) of the substack (78) in substack position 1 indicating remaining TSVs and the cross-hatched bars (29, 30) indicating PTVs created by blowing fuses 2 and 3 on each of the dies (21, 22) in the substack (78) in substack position 1, and black bars at reference (29) in the dies (23, 24) of the substack (80) in substack position 2 indicating remaining TSVs and the cross-hatched bars (28, 30) indicating PTVs created by blowing fuses 1 and 3 on each of the dies (23, 24) in the substack (80) in substack position 2.

Each instance of fuse blowing logic in the example of FIG. 5 is also configured with a set of vertical conductors (39), forming a vertical bus among instances of fuse blowing logic in stacked dies, and supporting communications regarding fuse blowing among a substrate and dies in a stack. Information that can be transmitted up through the vertical bus (39) among instances of fuse blowing logic in substacks includes an instruction to blow fuses, the substack position of the first die in the stack, and the number of dies in the substacks.

An example of a method of fuse blowing in substacks is for the fuse blowing logic (37), upon receiving an instruction to blow fuses, to receive also its substack position, its die's position in its substack, and its substack size. The fuse blowing logic can receive substack position, die position, and substack size from the substrate (26) or from a die lower in the stack through bus (39) as part of or in conjunction with an instruction to blow fuses. Then the fuse logic can carry out a process of blowing fuses by looking up its fuse blowing configuration with its substack position in stored data such as, for example, a storage arrangement like Table 2, and then blowing the fuses indicated by the "Fuses To Blow" column in the table. After the fuse logic in a stack position blows its fuses, the fuse logic determines, by comparing its position in its substack with the number of dies in its substack, whether its die is the top die in a substack. If the fuse logic is in a die whose die position in its substack is less than the size of the substack, then that fuse logic is in a die that is not the top die in the substack. If the fuse logic determines that it's die is not the top die in a substack, the fuse logic increments the value of the die position and sends the instruction to blow fuses, the substack position, and the incremented die position through bus (39) to the fuse blowing logic in the next higher die in the stack. If the fuse logic determines that it's die is the top die in a substack, the fuse logic increments the value of the substack position, resets the value of the die position in a substack to '1,' and sends the instruction to blow fuses, the incremented substack position, and the reset die position through bus (39) to the fuse blowing logic in the next higher die in the stack.

The fuse blowing logic in the top die in the overall stack can increment the substack position, reset the die position, and transmit the instruction to blow fuses upward through bus (39), despite the fact the instruction to blow fuses will have no effect when issued from the top die, exercising the algorithm because it must if all the dies are to be manufactured as identical. Alternatively, bus (39), in addition to the instruction to blow fuses, the substack position, and the die position can also carry an indication of the number of substacks in the stack, so that the fuse blowing algorithm in the fuse blowing logic in each die identically also retrieves its fuse blowing configuration, blows the fuses, determines whether it's die in the top dies in a substack, compares the substack position to the number of substacks in the stack, and transmits information upward only if the value of the current substack position is less than the number of substacks in the stack. In this way, the fuse blowing logic in the top die in the overall stack would not try to transmit anything upward after blowing its fuses.

This specification just described two fuse blowing procedures or algorithms for die stacks with substacks, one that operates without knowing the number of substacks in the stack and another that operates in dependence upon the number of substacks in the stack. A third method of blowing fuses would be for fuse blowing logic in each die to increment the substack position before retrieving a fuse configuration, blowing fuses, and passing values and instructions to the next die in the stack. In such a method, the source of the instruction to blow fuses and the first value of the substack position is configured to provide to the first die in the stack the initial value of the substack position as '0.' Methods of fuse blowing that first increment substack position can be adapted to operate with or without the parameter of the number of substacks in the stack, so that this specification now discloses four methods of fuse blowing. In addition, in implementations of die stacks that may be installed in environments likely to instruct the die stack to blow fuses every time a die stack is powered on, a fuse blowing procedure can include the steps of sensing whether fuses have already been blown and determining whether to blow fuses in dependence upon whether the fuses have already been blown, with or without the parameter of the number of substacks in the stack, thereby bringing this specification's count of methods of fuse blowing in substacks up to six. It is likely that persons of skill in the art will think of other procedures for blowing fuses in die stacks with substacks, and all such procedures are well within the scope of the present invention.

Figure 6:
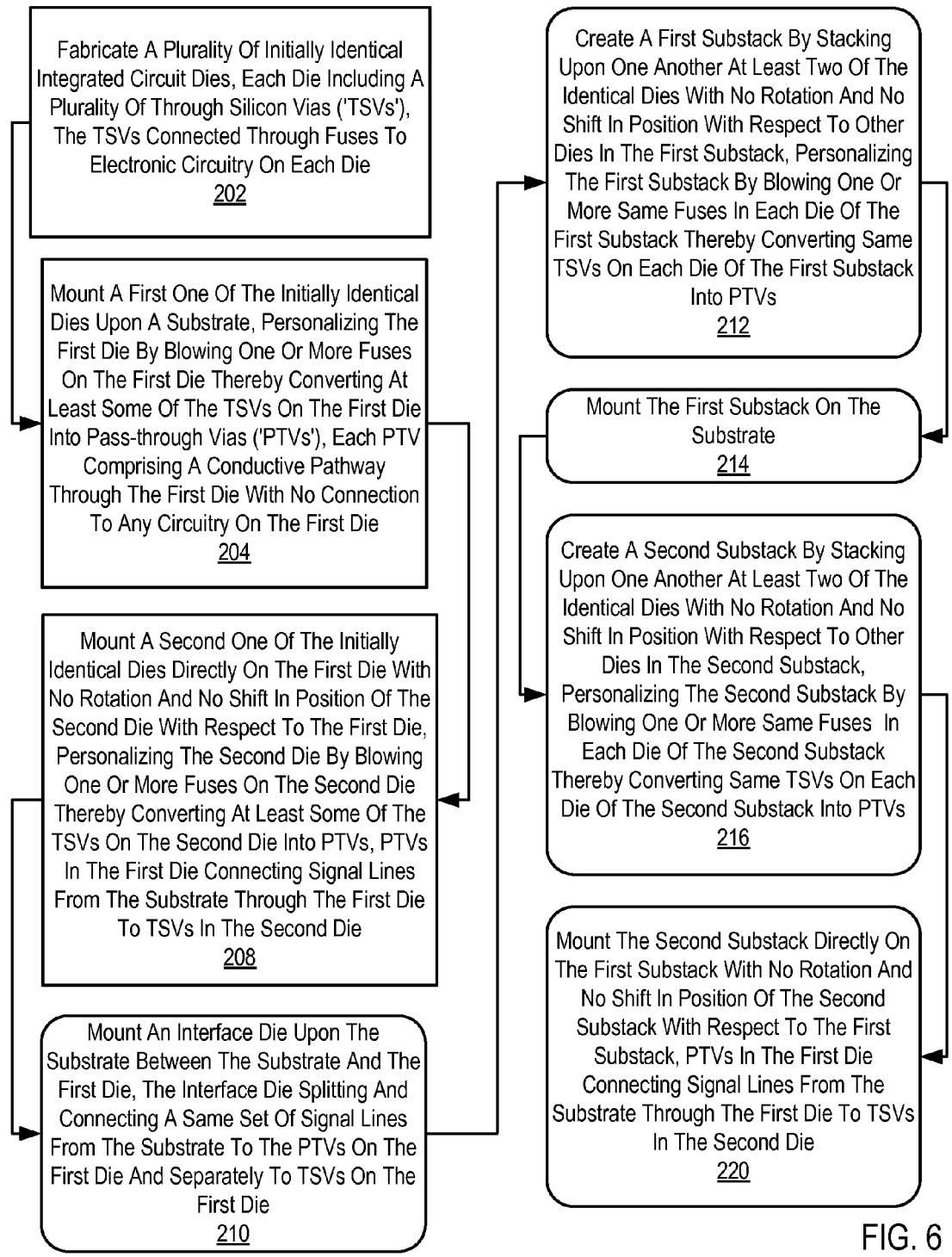
FIG. 6 sets forth a flow chart illustrating an example method of manufacturing an integrated circuit die stack according to embodiments of the present invention.

For further explanation, FIG. 6 sets forth a flow chart illustrating an example method of manufacturing an integrated circuit die stack according to embodiments of the present invention. The method of FIG. 6 fabricates integrated circuit die stacks like those described above with regard to FIGS. 1-5. For ease of explanation, therefore, the method of FIG. 6 is described here with reference to FIGS. 1-5 as well as FIG. 6, so that reference numbers in the discussion below are found not only on FIG. 6, but also on FIGS. 1-5.

The method of FIG. 6 includes fabricating (202) a plurality of initially identical integrated circuit dies (21, 22, 23), each die including a plurality of through TSVs, with the TSVs connected through fuses to electronic circuitry on each die. As initially manufactured, all of the vertical conductive signal paths (28, 29, 30) through the dies (21, 22, 23) are TSVs. The method of FIG. 6 also includes mounting (204) a first one of the initially identical dies (21) upon a substrate (26), personalizing the first die by blowing one or more fuses (33) on the first die thereby converting at least some of the TSVs on the first die into PTVs (29, 30), with each PTV implementing a conductive pathway through the first die with no connection to any circuitry on the first die.

The method of FIG. 6 also includes mounting (208) a second one of the initially identical dies (22) directly on the first die (21) with no rotation and no shift in position of the second die with respect to the first die, and personalizing the second die by blowing one or more fuses (33) on the second die thereby converting at least some of the TSVs on the second die into PTVs (28, 30), with the PTVs (29) in the first die connecting signal lines (48b, 51) from the substrate (26) through the first die (21) to TSVs (29) in the second die (22). The example die stacks described above with regard to FIGS. 2-4 each has a third die (23) in the die stack (20), but readers will recognize that including a third die in a die stack according to embodiments of the present invention, or indeed a fourth or fifth die, or any number of dies as will occur to those of skill in the art, is merely a matter of repeating the steps of the method of FIG. 6.

The method of FIG. 6 also includes mounting (210) an interface die (62 on FIGS. 3-4) upon the substrate (26) between the substrate and the first die (21), with the interface die (62) splitting and connecting a same set of signal lines (48) from the substrate (26) to the PTVs (29, 30) on the first die (21) and separately to TSVs (28) on the first die (21). As an alternative to a direct split of the signal lines, reference (64) on FIG. 3, the interface die can be configured to multiplex and demultiplex, reference (76) on FIG. 4, signal lines (48) from the substrate (26) to the PTVs (29, 30) on the first die (21) and separately to TSVs (28) on the first die (21), with the signal lines in the substrate (48), to the PTVs (70), and to the TSVs (68) all operating at a same clock speed. As a further alternative, the interface die (62 on FIG. 4) can be configured to multiplex and demultiplex, reference (76) on FIG. 4, signal lines (48) from the substrate with the signal lines (48) in the substrate operating at a first clock speed (63) and the interface die operating the signal lines to the PTVs (70) and to the TSVs (68) at a second clock speed (67 on FIG. 4), with the first clock speed sufficiently faster than the second clock speed to fit onto the signal lines (68, 70) of the interface die all communications between the substrate and the PTVs and the TSVs. Mounting (210) an interface die between the substrate and the first die in the die stack is depicted as an optional step in the flow chart of FIG. 6, because die stacks according to embodiments of the present invention may be fabricated with or without interface dies.

With reference to both FIG. 6 and also to FIG. 5: The method of FIG. 6 also includes creating (212) a first substack (78) by stacking upon one another at least two of the identical dies (21, 22) with no rotation and no shift in position with respect to other dies in the first substack, personalizing the first substack by blowing one or more same fuses (33) in each die of the first substack thereby converting same TSVs on each die of the first substack into PTVs (29, 30). Some TSVs are left TSVs (28) in the first substack (78) with connections (41) through fuses (33) to electronic circuitry (36) in the first substack. The method of FIG. 6 also includes mounting (214) the first substack upon the substrate (26).

The method of FIG. 6 also includes creating (216) a second substack (80) by stacking upon one another at least two of the identical dies (23, 24) with no rotation and no shift in position with respect to other dies in the second substack, personalizing the second substack by blowing one or more same fuses (33) in each die (23, 24) of the second substack (80) thereby converting some TSVs on each die of the second substack into PTVs (28, 30). Similarly as was done for the first substack, some TSVs are left TSVs (29) in the second substack (80) with connections (41) through fuses (33) to electronic circuitry (36) in the second substack. The method of FIG. 6 also includes mounting (220) the second substack (80) directly on the first substack (78) with no rotation and no shift in position of the second substack with respect to the first substack, so that PTVs (29) in the first substack connect signal lines (48b, 51) from the substrate (26) through the first substack (78) to TSVs (29) in the second substack (80).

Steps (212, 214, 216, 220) are depicted in the flow chart of FIG. 6 as optional because die stacks according to embodiments of the present invention may be implemented with or without substacks. A die stack containing only single, disparately personalized dies, as in the die stack of FIG. 2, contains no substacks—it being taken as trivial here to speak of a 'substack' as containing only one disparately personalized die. That is, a 'substack' as the term is used here contains at least two dies, identical in every way, identical in initial manufacture and identical in personalization by fuse blowing, and stacked with no rotation and no shift in position with respect to one another.

For further explanation, FIG. 7 sets forth a flow chart illustrating an example method of operation for an integrated circuit die stack (20) according to embodiments of the present invention. The method of FIG. 7 operates integrated circuit die stacks like those described above with regard to FIGS. 1-5. For ease of explanation, therefore, the method of FIG. 7 is described here with reference to FIGS. 1-5 as well as FIG. 7, so that reference numbers in the discussion below are found not only on FIG. 7, but also on FIGS. 1-5.

With reference both to FIG. 7 and also to FIG. 2: The method of FIG. 7 includes transmitting (302) an alternating current signal (63) from a substrate (26) through a first die (21) of a die stack (20) to electronic circuitry (36) in a second die (22) of the die stack, where the first die (21) is mounted directly upon the substrate (26) and manufactured to be initially identical to the second die with a plurality of through TSVs. As initially manufactured, all of the vertical conductive signal paths (28, 29, 30) through the dies (21, 22, 23) are TSVs. All the TSVs are initially connected through fuses (33, 34, 1, 2, 3) to electronic circuitry on each die, and the first die is later personalized by blowing on the first die one or more of the fuses, thereby converting the TSVs previously connected to blown fuses into PTVs. Each PTV implements a conductive pathway through a die with no connection to any circuitry on the die, and the second die (22) is mounted upon the first die (21) with no rotation and no shift in position with respect to the first die so that PTVs (29) in the first die connect signal lines (48b, 51) from the substrate (26) through the first die (21) to TSVs (29) in the second die (22).

The method of FIG. 7 also includes conducting (304), by the first die (21), the signal (63) through PTVs (29) in the first die to TSVs (29) in the second die (22), and conducting (306), by the second die (22), the signal (63) through TSVs (29) in the second die (22) to the electronic circuitry (36) on the second die. The second die (22) was manufactured to be initially identical to the first die (21) and later personalized by blowing fuses (33) connecting TSVs to circuitry on the second die.

With reference both to FIG. 7 and also to FIGS. 3-4: The method of FIG. 7 also includes conducting (308) the signal (63) through an interface die (62) mounted upon the substrate (26) between the substrate and the first die (21), where the interface die splits and connects (68, 70) a same set of signal lines (48, 52) from the substrate to the PTVs (29, 30) on the first die (21) and separately to TSVs (28) on the first die (21). The splitting of signals in the interface die (62) can be carried out by interface circuitry (64) in the interface die (62)—of the kind illustrated and described above with reference to FIG. 3.

The method of FIG. 7 also includes the alternative option of multiplexing and demultiplexing (310) by the interface die (26) the same set of signal lines (48, 52) from the substrate (26) to the PTVs (29, 30) on the first die (21) and separately to TSVs (28) on the first die (21), with the signal lines on the substrate (48, 52), to the PTVs (70), and to the TSVs (68) all operating at a same clock speed. The multiplexing and demultiplexing of signals in the interface die (62) can be carried out by mux/demux circuitry (76) in the interface die (62)—of the kind illustrated and described above with reference to FIG. 4.

As a further optional alternative, the method of FIG. 7 also includes multiplexing and demultiplexing (312) by the interface die (26) the same set of signal lines (48) from the substrate (26) to the PTVs (28) on the first die (21) and separately to TSVs (30) on the first die (21), including operating by the substrate (26) the signal lines (48) on the substrate (26) at a first clock speed (63) and operating by the interface die signal lines (68, 70) to the PTVs (28, 29) and to the TSVs (30) at a second clock speed (67), where the first clock speed is sufficiently faster than the second clock speed to fit onto the signal lines (68, 70) of the interface die (62) all communications between the substrate (26) and the PTVs (28, 29) and the TSVs (30). The steps of conducting (308) the signal through an interface die as well multiplexing and demultiplexing (310, 312) the signal by the interface die are depicted as optional steps in the flow chart of FIG. 7, because die stacks according to embodiments of the present invention may be operated with or without interface dies.

For further explanation, FIG. 8 sets forth a flow chart illustrating a further example method of operation for an integrated circuit die stack according to embodiments of the present invention. The method of FIG. 8 operates integrated circuit die stacks including substacks like those described above with regard to FIG. 5. For ease of explanation, therefore, the method of FIG. 8 is described here with reference to FIG. 5 as well as FIG. 8, so that reference numbers in the discussion below are found not only on FIG. 8, but also on FIG. 5. The method of FIG. 8 is similar to the method of FIG. 7, including as it does transmitting (302) an alternating current signal from a substrate, conducting (304) the signal through PTVs, and conducting (306) the signal through TSVs to electronic circuitry.

In the method of FIG. 8, however, transmitting (302) an alternating current signal (63) from a substrate (26) includes transmitting (314) the signal through a first substack (78) of the die stack (20) to electronic circuitry (36) in a second substack (80) of the die stack. The first die substack (78) is mounted upon the substrate (26), and the first substack is composed of two or more dies (21, 22) manufactured to be initially identical to dies in the second die substack (80) with a number of TSVs. Each of the dies (21, 22) in the first substack (78) is stacked directly upon one another with no rotation and no shift in position with respect to one another. Each vertical conductive pathway (28, 29, 30) through a die (21, 22, 23, 24) in the stack (20) is initially manufactured as a TSV, that is, connected (41) to circuitry (36) on a die through fuses (33). The dies of the first substack are then later personalized by blowing on the dies of the first substack a number of same fuses (33) in each die of the first substack, thereby converting the TSVs previously connected through the blown fuses into PTVs (29, 30), each PTV implementing a conductive pathway through a die with no connection to any circuitry on the die.

Also in the method of FIG. 8, conducting (304) the signal (63) through PTVs includes conducting (316), by the first die stack (78), the signal (63) through PTVs (29) of the first die substack (78) to TSVs (29) in the second die substack, and conducting (306) the signal (63) through TSVs includes conducting (318), by the second substack (80), the signals (63) through TSVs (29) of the second substack (80) to the electronic circuitry (36) in the second substack, where the second substack (80) includes dies (23, 24) manufactured to be initially identical to the dies (21, 22) of the first substack (78) and later personalized by blowing same fuses (33) in each of the dies of the second substack. "Same fuses" refers to blowing the same fuses in each die within a substack. The exact pattern or subset of the fuses blown differs across substacks. The fuses blown in the first substack (78) are not exactly the same subset of the fuses that are blown in the second substack (80). Within a substack, among the dies of a substack, the same fuses are blown. Each of the dies (23, 24) in the second substack (80) are stacked directly upon one another with no rotation and no shift in position with respect to one another, and the second substack is mounted upon the first substack so that the PTVs (29) in the first substack (78) connect conductors (48b, 51) from the substrate (26) through the first substack (78) to TSVs (29) in the second substack (80).

In view of the explanations set forth above, readers will recognize that the benefits of integrated circuit die stack having initially identical dies personalized with fuses according to embodiments of the present invention include:

Substantial reduction of bus signal line loads when stacking multiple dies, hence easier impedance matching and better control of bus noise, Higher signal quality on the vias in the dies of a stack, Support for faster bus speeds on the vias in the dies of a stack, Flexible support for bus structures completely internal to the die stack, with no requirement whatsoever for external wiring to connect signals, common, or power up through the stack, and Flexible support for multiple different bus structures in a single die stack, despite the fact that all the dies in a die stack, with the optional exception of an interface die, are initially identical.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An integrated circuit die stack comprising:
a first die mounted upon a substrate; and
a second die mounted on the first die; both dies having a plurality of through silicon vias ('TSVs'), the TSVs connected through fuses to electronic circuitry on each die,
wherein a portion of the TSVs of each die are connected to blown fuses and converted to pass-through vias ('PTVs'), wherein the second die is mounted upon the first die so that the PTVs in the first die connect signal lines from the substrate through the first die to TSVs in the second die; and
an interface die mounted upon the substrate between the substrate and the first die splitting and connecting a same set of signal lines from the substrate to the PTVs on the first die and separately to TSVs on the first die.

2. The die stack of claim 1 wherein the substrate comprises a plurality of conductors connected to conductive pathways in the dies, the conductors including power lines, common lines, and the signal lines.

3. The die stack of claim 1 further comprising:
a first die substack mounted upon the substrate, the first substack comprising two or more dies manufactured to be initially identical to dies in a second die substack with TSVs, the TSVs connected through fuses to electronic circuitry on each of the dies of the first substack, the dies of the first substack personalized by blowing on the dies of the first substack a number of same fuses in each die of the first substack, converting the TSVs previously connected through the blown fuses into PTVs, each of the dies in the first substack stacked directly upon one another with no rotation and no shift in position with respect to one another; and
the second substack, the second substack comprising dies manufactured to be initially identical to the dies of the first substack and later personalized by blowing same fuses in the dies of the second substack, each of the dies in the second substack stacked directly upon one another with no rotation and no shift in position with respect to one another, the second substack mounted upon the first substack so that the PTVs in the first substack connect conductors from the substrate through the first substack to TSVs in the second substack.

4. The die stack of claim 2 further comprising:
the interface die multiplexing and demultiplexing the same set of signal lines from the substrate to the PTVs on the first die and separately to TSVs on the first die, the signal lines on the substrate, to the PTVs, and to the TSVs all operating at a same clock speed.

5. The die stack of claim 2 further comprising:
an interface die mounted upon the substrate between the substrate and the first die in the dies stack, the interface die multiplexing and demultiplexing a same set of signal lines from the substrate to the PTVs on the first die and separately to TSVs on the first die, the substrate operating the signal lines on the substrate at a first clock speed and the interface die operating the signal lines to the PTVs and to the TSVs at a second clock speed, the first clock speed sufficiently faster than the second clock speed to fit onto the signal lines of the interface die all communications between the substrate and the PTVs and the TSVs.

6. A method comprising:
fabricating a plurality of initially identical integrated circuit dies, each die including a plurality of TSVs, the TSVs connected through fuses to electronic circuitry on each die;
mounting a first one of the initially identical dies upon a substrate, wherein a portion of the TSVs of the first die are connected to blown fuses and converted to pass-through vias ('PTVs');
mounting a second one of the initially identical dies directly on the first die, wherein a portion of the second die are connected to blown fuses and converted to PTVs, the second die mounted on the first die such that, wherein the PTVs in the first die connect signal lines from the substrate through the first die to TSVs in the second die; and
mounting an interface die upon the substrate between the substrate and the first die, the interface die splitting and connecting a same set of signal lines from the substrate to the PTVs on the first die and separately to TSVs on the first die.

7. The method of claim 6 wherein the substrate comprises a plurality of conductors connected to conductive pathways in the dies, the conductors including power lines, common lines, and the signal lines.

8. The method of claim 6 further comprising:
mounting an interface die upon the substrate between the substrate and the first die, the interface die multiplexing and demultiplexing a same set of signal lines from the substrate to the PTVs on the first die and separately to TSVs on the first die, the signal lines on the substrate, to the PTVs, and to the TSVs all operating at a same clock speed.

9. The method of claim 6 further comprising:
mounting an interface die upon the substrate between the substrate and the first die, the interface die multiplexing and demultiplexing a same set of signal lines from the substrate to the PTVs on the first die and separately to TSVs on the first die, the substrate operating the signal lines on the substrate at a first clock speed and the interface die operating the signal lines to the PTVs and to the TSVs at a second clock speed, the first clock speed sufficiently faster than the second clock speed to fit onto the signal lines of the interface die all communications between the substrate and the PTVs and the TSVs.

10. The method of claim 6 further comprising:
creating a first substack by stacking upon one another at least two of the identical dies with no rotation and no shift in position with respect to other dies in the first substack, personalizing the first substack by blowing one or more same fuses in each die of the first substack thereby converting same TSVs on each die of the first substack into PTVs;
mounting the first substack on the substrate;
creating a second substack by stacking upon one another at least two of the identical dies with no rotation and no shift in position with respect to other dies in the second substack, personalizing the second substack by blowing one or more same fuses in each die of the second substack thereby converting some TSVs on each die of the second substack into PTVs;
mounting the second substack directly on the first substack with no rotation and no shift in position of the second substack with respect to the first substack, PTVs in the first substack connecting signal lines from the substrate through the first substack to TSVs in the second substack.

11. A method comprising:
transmitting an alternating current signal from a substrate through a first die of the die stack to electronic circuitry in a second die of the die stack, the first die mounted directly upon the substrate, the first die and second die each having a plurality of through silicon vias TSVs, the TSVs connected through fuses to electronic circuitry on each die, wherein a portion of the TSVs of each die are connected to blown fuses and converted to PTVs, the second die mounted upon the first die with respect to the first die so that PTVs in the first die connect signal lines from the substrate through the first die to TSVs in the second die;
conducting, by the first die, the signal through PTVs in the first die to TSVs in the second die;
conducting, by the second die, the signal through TSVs in the second die to the electronic circuitry on the second die; and
conducting the signal through an interface die mounted upon the substrate between the substrate and the first die, the interface die splitting and connecting a same set of signal lines from the substrate to the PTVs on the first die and separately to TSVs on the first die.

12. The method of claim 11 wherein the substrate comprises a plurality of conductors connected to conductive pathways in the dies, the conductors including power lines, common lines, and the signal lines.

13. The method of claim 11 further comprising:
wherein conducting the signal through an interface die mounted upon the substrate between the substrate and the first die includes multiplexing and demultiplexing by the interface die the same set of signal lines from the substrate to the PTVs on the first die and separately to TSVs on the first die, the signal lines on the substrate, to the PTVs, and to the TSVs all operating at a same clock speed.

14. The method of claim 11 further comprising:
wherein conducting the signal through an interface die mounted upon the substrate between the substrate and the first die includes multiplexing and demultiplexing by the interface die the same set of signal lines from the substrate to the PTVs on the first die and separately to TSVs on the first die, the substrate operating the signal lines on the substrate at a first clock speed and the interface die operating the signal lines to the PTVs and to the TSVs at a second clock speed, the first clock speed sufficiently faster than the second clock speed to fit onto the signal lines of the interface die all communications between the substrate and the PTVs and the TSVs.

15. The method of claim 11 wherein:
transmitting an alternating current signal from a substrate further comprises transmitting the signal through a first substack of the die stack to electronic circuitry in a second substack of the die stack, the first die substack mounted upon the substrate, the first substack comprising two or more dies manufactured to be initially identical to dies in a second die substack with a number of TSVs, the TSVs connected through fuses to a same circuit on each of the dies of the first substack, the dies of the first substack personalized by blowing on the dies of the first substack a number of same fuses in each die of the first substack, converting the TSVs previously connected through the blown fuses into PTVs, each PTV comprising a conductive pathway through a die with no connection to any circuitry on the die, each of the dies in the first substack stacked directly upon one another with no rotation and no shift in position with respect to one another; and
conducting the signal through PTVs further comprises conducting, by the first die substack, the signal through PTVs of the first die substack to TSVs in the second die substack; and
conducting the signal through TSVs further comprises conducting, by the second substack, the signals through TSVs of the second substack to the electronic circuitry in the second substack, the second substack comprising dies manufactured to be initially identical to the dies of the first substack and later personalized by blowing same fuses in each of the dies of the second substack, each of the dies in the second substack stacked directly upon one another with no rotation and no shift in position with respect to one another, the second substack mounted upon the first substack so that the PTVs in the first substack connect conductors from the substrate through the first substack to TSVs in the second substack.

* * * * *